United States Patent
Franke et al.

(10) Patent No.: US 10,582,642 B2
(45) Date of Patent: Mar. 3, 2020

(54) POUROUS HEAT SINK WITH CHIMNEY

(71) Applicant: Siemens Aktiengesellschaft, Munich (DE)

(72) Inventors: Martin Franke, Berlin (DE); Peter Frühauf, Falkensee (DE); Rüdiger Knofe, Teltow (DE); Bernd Müller, Falkenberg (DE); Stefan Nerreter, Heidesse OT Blossin (DE); Michael Niedermayer, Glienicke (DE); Ulrich Wittreich, Velten (DE); Manfred Zäske, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/751,243

(22) PCT Filed: Jul. 8, 2016

(86) PCT No.: PCT/EP2016/066302
§ 371 (c)(1),
(2) Date: Feb. 8, 2018

(87) PCT Pub. No.: WO2017/029029
PCT Pub. Date: Feb. 23, 2017

(65) Prior Publication Data
US 2018/0235101 A1    Aug. 16, 2018

(30) Foreign Application Priority Data

Aug. 14, 2015 (DE) ........................ 10 2015 215 570

(51) Int. Cl.
*H05K 7/00*      (2006.01)
*H05K 7/20*      (2006.01)
*H05K 1/02*      (2006.01)

(52) U.S. Cl.
CPC ........... *H05K 7/2039* (2013.01); *H05K 7/209* (2013.01); *H05K 1/0203* (2013.01)

(58) Field of Classification Search
CPC .... H05K 7/2039; H05K 7/209; H05K 1/0203; H01L 23/3773; H01L 23/3736; H01L 23/467; F28F 13/003; F28F 2215/06
See application file for complete search history.

(56) References Cited

U.S. PATENT DOCUMENTS

| 5,145,001 A | * | 9/1992 | Valenzuela | ............. F28F 3/086 165/164 |
| 5,321,888 A | * | 6/1994 | Nemes | ................. H05K 7/1404 165/80.2 |

(Continued)

FOREIGN PATENT DOCUMENTS

| DE | 20010663 U1 | 10/2000 | ............... G06F 1/20 |
| DE | 10055454 A1 | 5/2002 | ............... F28F 13/00 |

(Continued)

OTHER PUBLICATIONS

German Office Action, Application No. 102015215570.6, 9 pages, dated Apr. 15, 2016.

(Continued)

*Primary Examiner* — Travis C Ruby
(74) *Attorney, Agent, or Firm* — Slayden Grubert Beard PLLC

(57) ABSTRACT

Examples include cooling members for electronic components and/or methods for producing cooling members. The members may include: an assembly side for an electronic component and an upper side opposite the assembly side; at least one cooling chimney extending through the cooling member away from the assembly side which leads to an outlet opening in the upper side of the cooling member; and a number of cooling channels. The cooling channels may have a smaller cross-section than a cross-section of the (Continued)

cooling chimney which lead from inlet openings in the upper side of the cooling member to the cooling chimney.

13 Claims, 3 Drawing Sheets

(56) References Cited

U.S. PATENT DOCUMENTS

| | | | | |
|---|---|---|---|---|
| 5,519,924 | A * | 5/1996 | Fujita | D02J 13/001 165/905 |
| 5,781,411 | A | 7/1998 | Feenstra et al. | 361/704 |
| 6,134,783 | A * | 10/2000 | Bargman | B21C 23/20 29/890.03 |
| 6,591,897 | B1 | 7/2003 | Bhatti et al. | 165/80.3 |
| 6,734,363 | B1 * | 5/2004 | Horton | H01L 23/142 174/117 F |
| 2006/0214177 | A1 * | 9/2006 | Jones | F21V 29/30 257/99 |
| 2007/0131406 | A1 | 6/2007 | Tsai | 165/185 |
| 2009/0008066 | A1 * | 1/2009 | Meng | F04D 29/582 165/104.33 |
| 2009/0321045 | A1 | 12/2009 | Hemon et al. | 165/80.2 |
| 2016/0069622 | A1 * | 3/2016 | Alexiou | G06F 1/1656 165/146 |

FOREIGN PATENT DOCUMENTS

| | | | |
|---|---|---|---|
| DE | 10123456 A1 | 11/2002 | ............ F28F 13/00 |
| DE | 10207671 A1 | 9/2003 | ............ F28F 13/00 |
| DE | 10244805 A1 | 4/2004 | ............ F28F 13/00 |
| DE | 202011000830 U1 | 8/2011 | ............ F28D 20/02 |
| DE | 102011101302 A1 | 11/2012 | ............... B22F 5/10 |
| DE | 102011079634 A1 | 1/2013 | ............... F28F 3/00 |
| DE | 102014118177 A1 | 6/2015 | ............ B22F 3/105 |
| EP | 1430530 B1 | 9/2009 | ............ F28F 13/00 |
| JP | 07202085 A | 8/1995 | ............ H01L 23/36 |
| WO | 2017/029029 A1 | 2/1917 | ............ H01L 23/373 |
| WO | 2006/046022 A1 | 5/2006 | ............ H01L 23/467 |
| WO | 2012/053697 A1 | 4/2012 | ............ H01L 23/34 |
| WO | 2013/153486 A1 | 10/2013 | ............ F21V 29/00 |
| WO | 2016/046022 A1 | 3/2016 | ............ C23C 16/56 |

OTHER PUBLICATIONS

International Search Report and Written Opinion, Application No. PCT/EP2016/066302, 8 pages, dated Oct. 10, 2016.

Japanese Office Action, Application No. 2018507490, 10 pages, dated Feb. 19, 2019.

Chinese Office Action, Application No. 201680047415.1, 14 pages, dated Nov. 6, 2019.

* cited by examiner

POUROUS HEAT SINK WITH CHIMNEY

CROSS-REFERENCE TO RELATED APPLICATIONS

This application is a U.S. National Stage Application of International Application No. PCT/EP2016/066302 filed Jul. 8, 2016, which designates the United States of America, and claims priority to DE Application No. 10 2015 215 570.6 filed Aug. 14, 2015, the contents of which are hereby incorporated by reference in their entirety.

TECHNICAL FIELD

The present disclosure relates to electronics. The teachings thereof may be embodied in cooling members for electronic components and/or methods for producing cooling members with an assembly side for an electronic component.

BACKGROUND

Electronic components may include passive cooling elements to discharge heat produced during the operation of the electronic component. There has been a steady increase of power converted by electronic components and at the same time miniaturization of the structural elements used. This leads to increases in the quantity of heat in relation to available surface area of the electronic component. The increasingly small contact surfaces between the electronic components and the cooling members or media which are used make effective removal of heat from the electronic components difficult. Of course, reliable removal of heat is a prerequisite for correct function of the circuits which are produced with the electronic components.

In conventional cooling member technologies, cooling members, for example, of aluminum, provide an assembly side which can be placed on a boundary of the electronic component. The cooling members often have ribs to increase the surface for heat discharge and can, for example, be produced in aluminum in a cost-effective manner as an extruded profile. However, the possible heat discharge of such passive coolers is linked with physical limits so that conventional cooling elements during heat removal reach their power limits.

In place of aluminum, a more highly thermally conductive metal, such as copper, can also be selected. However, such cooling members may be uneconomical as a result of higher material and production costs.

Active cooling includes forced convection of a cooling medium, for example air, moved by means of a fan or a liquid which can be used, for example, in so-called heat pipes. Such heat removal solutions are also more expensive than passive cooling and additionally also less reliable so that it is desirable to dispense with an active cooling solution.

SUMMARY

The teachings of the present disclosure may provide a method for producing a cooling member or a cooling member by means of which a comparatively high heat removal power can be implemented in a comparatively simple and reliable manner. For example, a cooling member having an assembly side (15) for an electronic component and an upper side opposite the assembly side (15) may include at least one cooling chimney (23) which extends away from the assembly side (15) and which leads to an outlet opening (24) in the surface (22) of the cooling member, which surface forms the upper side of the cooling member. Further, in the cooling member there may extend a large number of cooling channels (20) which have a smaller cross-section than the cooling chimney (23) and which lead from inlet openings (21) in the surface of the cooling member to the cooling chimney (23).

In some embodiments, a plurality of cooling chimneys (23) extend parallel with each other in the cooling member.

In some embodiments, the at least one cooling chimney (23) extends perpendicularly to the orientation of the assembly side (15).

In some embodiments, the cooling channels (20) are formed by a three-dimensional grid.

In some embodiments, the cooling channels (20) are formed by an open-pored material, wherein the open-pored material comprises a metal foam.

In some embodiments, a cover plate (27) is formed on the upper side of the cooling member (14).

In some embodiments, the assembly side is formed by a solid base plate (16).

In some embodiments, the at least one cooling chimney (23) is extended by means of a pipe attachment (26) which is secured to the outlet opening (24).

As another example, some embodiments may include a method for producing a cooling member (14) having an assembly side (15) for an electronic component, characterized in that the cooling member (14) is produced with a hollow inner structure by means of an additive production method, wherein there is produced as an inner structure at least one cooling chimney (23) which extends away from the assembly side (15) and which leads to an outlet opening (24) in a surface of the cooling member (14) and a large number of cooling channels (20) with a smaller cross-section than the cooling chimney (23) are produced, wherein these inlet openings (21) lead in the surface of the cooling member to the cooling chimney (23).

In some embodiments, the cooling member (14) is produced on a base plate (16) which, after the additive production method has been ended, forms a portion of the cooling member.

In some embodiments, the cooling channels (20) are produced as open-pored structures.

In some embodiments, in order to produce the open-pored structure, a selective laser sintering is used.

In some embodiments, the cooling channels (20) are produced as a three-dimensional grid (28).

In some embodiments, in the case of additive production of the cooling member (14), materials with different thermal conductivity are used, wherein in regions of the cooling member (15) closer to the assembly side (15), the material with a higher thermal conductivity is used and, in regions of the cooling member (15) further away from the assembly side (15), the material with a lower thermal conductivity is used.

BRIEF DESCRIPTION OF THE DRAWINGS

Further details of the invention are described below with reference to the drawings. Identical or corresponding drawing elements are each given the same reference numerals in the individual Figures and are explained several times only in so far as there are differences between the individual Figures, in which.

DETAILED DESCRIPTION

Figure 1:
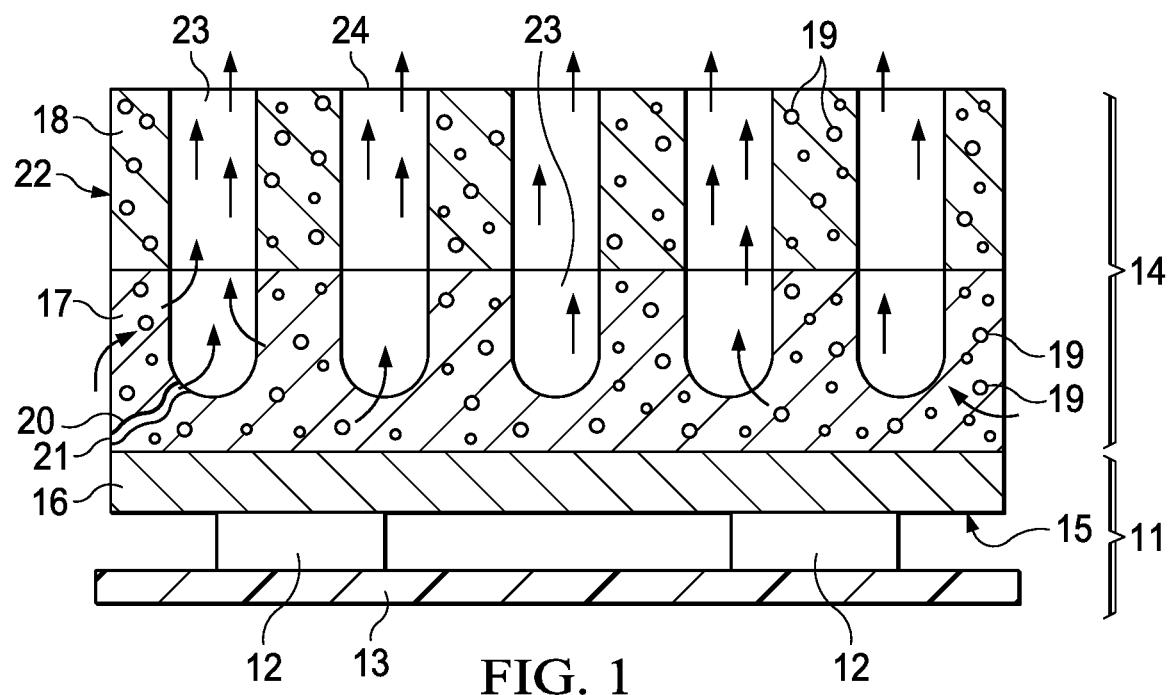
FIGS. 1 to 3 are schematic cross-sections of different embodiments of the cooling member according to the teachings of the present disclosure.

In some embodiments, the cooling member may include at least one cooling chimney which extends away from the assembly side and which leads to an outlet opening in a surface of the cooling member. Since the cooling member is assembled with the assembly side thereof downward on the upper side of the electronic component which is intended to be cooled, an extension of the cooling chimney away from this assembly side means that the cooling chimney extends upward relative to the surface of the cooling member. This property of the cooling chimney forms a prerequisite for the technical function thereof, that is to say, a chimney effect is used so that the hot air located in the cooling chimney rises upward and produces a reduced pressure at the bottom of the cooling chimney.

In some embodiments, a large number of cooling channels which have a smaller cross-section than the cooling chimney lead from inlet openings in the surface of the cooling member to the cooling chimney. The reduced pressure in the lower region of the cooling chimney results in there being drawn through the cooling channels air which flows via the inlet openings into the cooling channels. This air cools the structure of the cooling member surrounding the cooling channels so that advantageously the cooling effect in the cooling member is not supported only by means of heat conduction, but instead also by means of convection of the air located in the cooling member. The cooling power or heat removal power of the passive cooling member is thereby increased. As a result of the passive operating method of the cooling member, this may also be more reliable during operation than an active cooling system.

The smaller cross-section of the cooling channels results in the surface which is provided by the cooling channels for heat transfer from the material of the cooling member being increased. The air can therefore become heated to a comparatively greater extent, whereby the chimney effect which arises in the cooling chimney is increased. Again, a more rapid air exchange is thereby possible, which optimizes the cooling power.

The cooling member can be used to cool any appropriate electronic components. "Electronic component" in the context of this application refers to electronic structural elements but also complete electronic sub-assemblies, in particular components of the electronic power system, whose function is linked with a powerful heat development. The assembly side of the cooling member is normally constructed in a planar manner. However, it is also conceivable for the geometry of the assembly side to be adapted to the topology of an electronic component, e.g., an electronic sub-assembly assembled not on a circuit carrier with more complex geometry, such as, for example, a housing.

In the cooling member, at least one cooling chimney, alternatively also a large number of cooling chimneys, may be used. When a plurality of cooling chimneys is provided, they may extend parallel with each other in the cooling member. The material between the cooling chimneys in which the cooling channels extend forms a constant wall thickness between the cooling chimneys and the cooling channels can be distributed in a uniform manner in this material. The at least one cooling chimney to extend perpendicularly to the orientation of the assembly side. As a result of this orientation, the chimney effect can be maximized since the heated air can rise perpendicularly upward in an unimpeded manner.

In some embodiments, the cooling channels may be formed using an open-pored material. The open-pored material allows the cooling air to travel through the pores from the surface of the cooling member into the cooling chimneys. In such embodiments, the open pores provide a comparatively large surface, via which a heat transfer from the material of the cooling member to the cooling air can take place. In some embodiments, the open-pored material may be constructed in multiple layers. In this instance, there is a layer closer to the assembly side to have a higher thermal conductivity than a layer which is further away from the assembly side.

In some embodiments, the open-pored material may be constructed in two layers so that the lower layer forms the layer closer to the assembly side and directly adjoins the upper layer as the layer further away from the assembly side. These embodiments provide that the layer with the higher thermal conductivity is suitable for rapidly directing the heat supplied by the electronic component into the cooling member to the cooling channels. The cooling air in the cooling channels is thereby heated significantly. The air rising in the cooling chimneys is in contrast intended to cool as little as possible so that the chimney effect can be used in an optimum manner. Therefore, a lower heat conductivity of the material in the region of the cooling member further away from the assembly side may be used. This may then become heated to a lesser extent, wherein the cooling channels in the region of the cooling member additionally ensure a degree of cooling thereof.

In some embodiments, the open-pored material includes a metal foam. A metal foam may have an adequate thermal stability in addition to mechanical stability and has in particular as a material close to the assembly face an adequate thermal conductivity in order to transport the heat from the assembly side toward the cooling channels. In addition, the assembly side may be formed by a solid base plate of the cooler. There is thereby available a heat sink which, as a result of the thermal capacity thereof, ensures adequate cooling of the electronic component, even at load peaks.

The base plate may, for example, be formed from copper, wherein the heat may be discharged in a comparatively rapid manner and transmitted to the cooling channels (effect of the heat dissipation). The remaining cooling member may in this instance be formed by another more cost-effective material, such as, for example, aluminum. Alternatively, it is also possible for the base plate to be produced integrally with the remaining cooling member.

In this instance, a method for additive production may be used by way of example (see below for further details in this regard).

In some embodiments, the at least one cooling chimney may be extended by means of a pipe attachment which is secured to the outlet opening. With at the same time comparatively low material complexity, a cooling chimney with a relatively large height can thereby be produced, wherein the pipe attachment extends the chimney shaft of the cooling chimney by being secured to the outlet opening. The pipe attachment may be a standardized component or also, for example, a pipe piece which is cut to length. This may be welded, adhesively bonded, soldered, and/or pressed onto the cooling member.

In some embodiments, a method according to the teachings herein may produce a cooling member with a hollow inner structure by means of an additive production method. In this instance, the inner structure may include at least one cooling chimney which extends away from the assembly side and which leads to an outlet opening in the surface of the cooling member. Furthermore, a large number of cooling channels with a smaller cross-section than the cooling chimney are produced, wherein they lead from inlet openings in the surface of the cooling member to the cooling chimney.

The use of an additive production method may allow the geometry of the inner structure to be adapted to the corresponding application case. With the production complexity remaining the same, it is possible to produce any complex channel structures, which can also be linked with each other or can have different cross-sections. For example, it is possible to configure the cooling channels in the form of a tree. From the surface of the cooling member, the individual cooling channels then merge increasingly to form a main channel which then opens in the cooling chimney. To introduce cooling air without significant heating into a region inside the cooling member, the tree-like structure of the cooling channels may be constructed the other way around, e.g., a large cooling channel leads from the surface of the cooling member into the region of the cooling member which is intended to be cooled and branches in the region of the portion of the cooling member which is intended to be cooled in order to subsequently open in the cooling chimney.

In some embodiments, the cooling member may be produced on a base plate which, after the additive production method has been ended, forms a portion of the cooling member. As already mentioned, the cooling member may have a solid base plate which can be used for the effect of a thermal dissipation. This means that the heat which is discharged from the electronic component may be rapidly distributed in the base plate as a result of the effect of the thermal conduction (thermal dissipation), and a larger surface area of the cooling channels can be used for heat transfer. The production of the cooling member directly on the base plate further provides the solid base plate does not have to be produced in an additive manner, wherein in this instance a relatively high production complexity can be reduced. Furthermore, a material which is suitable for the effect of thermal dissipation, such as, for example, copper can be used for the base plate. In some embodiments, the component after the production does not have to be separated from the construction platform since the base plate itself acts as a base for the cooling member which is intended to be produced and can thereby remain connected thereto.

In some embodiments, the cooling channels include open-pored structures. An open-pored structure is open-pored, that is to say, the cooling air can flow through the pores which are connected to each other and which form a channel system. In this instance, the pores may provide a comparatively large surface are for heat transfer. To produce the open-pored structure, a selective laser sintering operation may be used. In this instance, the powdered material is heated by means of the laser only to such an extent that the powder particles are sintered with each other, leaving a channel system which constitutes the open-pored structure between the particles. In some embodiments, selective laser sintering may also be combined with selective laser melting which can be carried out with a greater laser power so that the powder particles melt. In this manner, an installation for combined laser sintering and laser melting may be used to make a cooling member in which both solid regions, such as, for example, a base plate, and open-pored regions for forming the cooling channels are contained.

In some embodiments, the cooling channels comprises a three-dimensional grid. The three-dimensional grid may have a comparatively low flow resistance for the cooling air which flows around the grid. The cooling channels are may be formed by the intermediate spaces which are connected to each other between the grid structures. The grid can be formed by grid rods which merge in nodes. The grid itself is suitable for directing the heat in the grid rods into the cooling channel, wherein it is discharged via the surface of the grid rods to the cooling air.

In some embodiments, in the case of the additive production of the cooling member, materials with different thermal conductivity are used, wherein, in regions of the cooling member closer to the assembly side, the material with a higher thermal conductivity is used and, in regions of the cooling member further away from the assembly side, the material with a lower thermal conductivity is used. The structure which is constructed in this manner has already been described so that reference can be made thereto at this point.

FIG. 1 shows an electronic sub-assembly 11 which has two electronic components 12 in the form of structural elements which are mounted on a circuit carrier 13. The circuit carrier 13 may include a printed circuit board. However, other forms of circuit carriers, which may be formed, for example, by means of an MID housing (not illustrated—MID means Molded Interconnect Device), may be used.

A cooling member 14 may be placed and secured with the assembly side 15 thereof on the electronic components 12. The assembly side 15 includes a base plate 16 which takes up a portion of the cooling member 14. Furthermore, there may be formed on the base plate 16 a lower layer 17 and on this an upper layer 18. Both layers may be produced from an open-pored material, such as, for example, a metal foam, wherein open pores 19 are indicated in FIG. 1.

The pores 19 form cooling channels 20, of which one is illustrated in FIG. 1 by way of example. This cooling channel 20 extends from an inlet opening 21 in the surface 22 of the cooling member 14 toward a cooling chimney 23. In addition to the cooling channel 20 illustrated, many additional cooling channels which are formed by the open-pored material (not illustrated in FIG. 1) open in this and in the other cooling chimneys 23. The cooling chimneys 23 extend away from the assembly side 15. Since the assembly side 15 is orientated in a horizontal manner and faces downward to the electronic components 12, the cooling chimneys 23 are oriented perpendicularly upward. They open in outlet openings 24, in the surface 22 which forms the upper side of the cooling member, so that the cooling air rising as a result of the chimney effect can be discharged from the cooling member. The flow of the cooling air is indicated by arrows in FIG. 1 (and in FIGS. 2 and 3).

Figure 2:
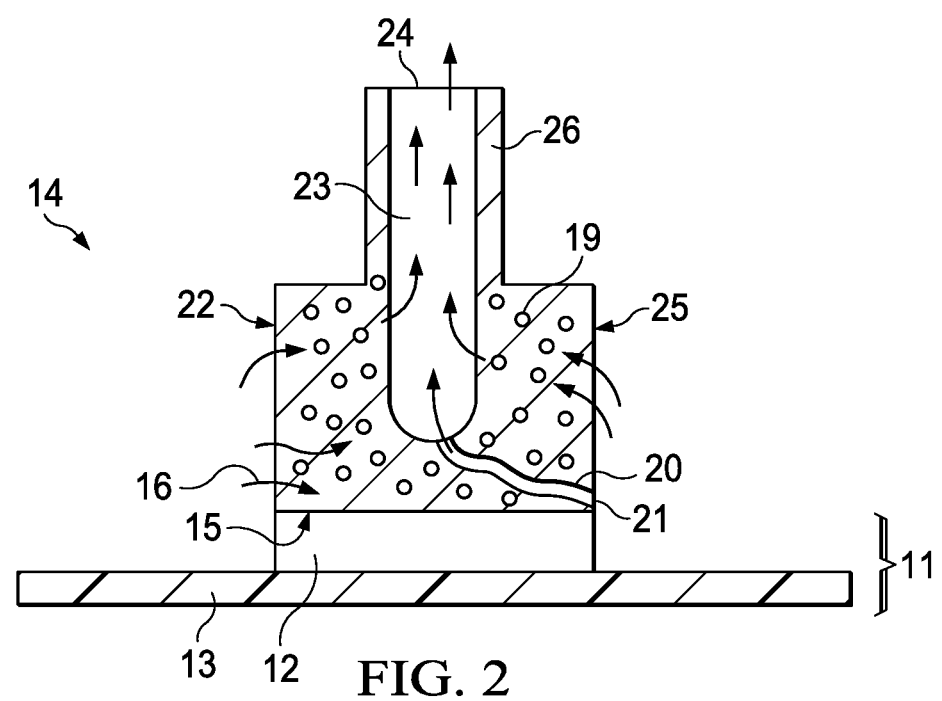

In FIG. 2, another variant of the cooling member 14 is illustrated. This was produced by means of additive production methods (laser melting and laser sintering, see also the explanation of FIGS. 6 and 7). Therefore, the complete cooling member 25 is constructed in an integral manner. It comprises different zones, that is to say, the base plate 16, a region which is located thereabove with pores 19 and a pipe attachment 26 which extends the cooling chimney 23 in a manner comparable to a smokestack. If this embodiment is compared with FIG. 1, it becomes clear that, in the region of the cooling chimney 23 which is formed by the upper layer 18, material can be saved. This region is replaced by the pipe attachments 26.

The cooling member 25 may be precisely adapted in terms of its size to the electronic component 12 and placed thereon. Since the spatial dimensions of a single electronic component are comparatively small, the cooling member 14 may require only one cooling chimney 23. The number of cooling chimneys which to be provided in a cooling member 14 is substantially dependent on the requirement that the cooling channels (according to FIG. 2 formed by the pores 19) should not exceed a specific length.

Figure 3:
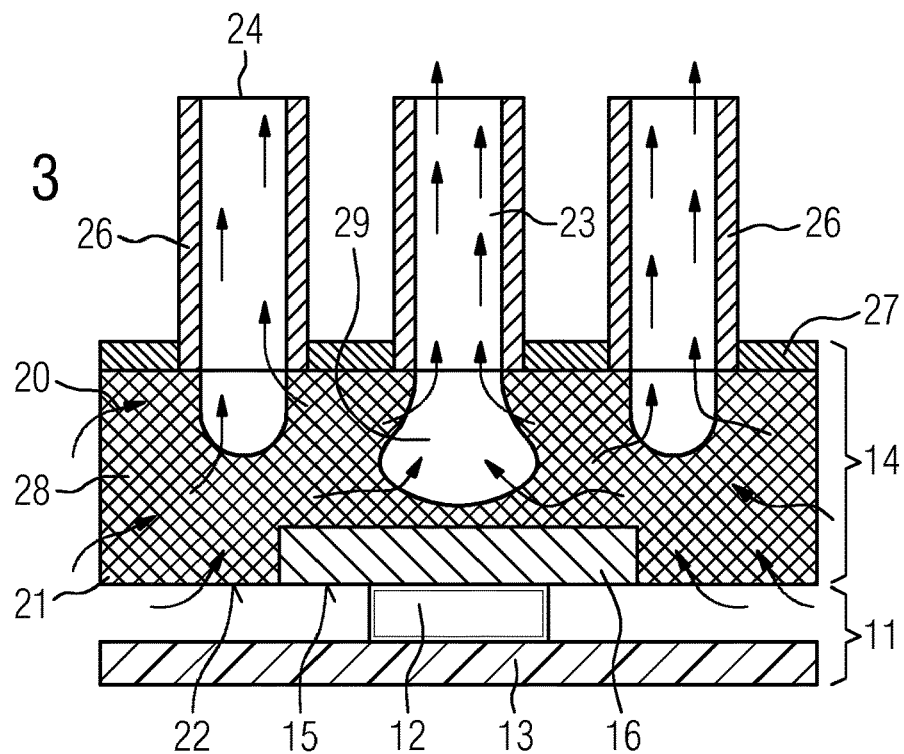

FIG. 3 shows a variant of the cooling member 14 in which a plurality of pipe attachments 26 and consequently also a plurality of cooling chimneys 23 are used. The cooling member 14 in FIG. 3 has been produced by means of laser melting. It has as a base plate 16 a solid region, wherein there is also formed at the opposite upper side of the cooling member 14 a cover plate 27. The base plate 16 and cover plate 27 are produced in one piece, wherein these structures are connected to each other inside the cooling member by means of a three-dimensional grid 28 (indicated in FIG. 3 by cross-hatching). This three-dimensional grid at the same time provides a channel structure since the cooling air can flow between the individual struts of the grid and cools the grid rods in this case.

It can be seen that the cooling chimneys when an additive production method is selected can be constructed with different cross-sections. It is thus possible, for example, as illustrated in FIG. 3, for the central cooling chimney to have a bottle-like expansion 29 in order to influence the length of the surrounding cooling channels. Efficient cooling of the upper side of the base plate 16 is thereby possible. The two cooling chimneys 23 which are arranged beside the central cooling channel 23 do not extend so deeply into the cooling member 14 that the cooling air from the surface 22 can also pass through the grid 28 to the central cooling chimney 23.

In addition to stabilizing the grid 28, the cover plate 27 also serves to receive the pipe attachments 26. These are inserted by means of a press-fit in the cooling member 14 and extend with the front-side ends thereof directly as far as the grid 28.

Figure 4:
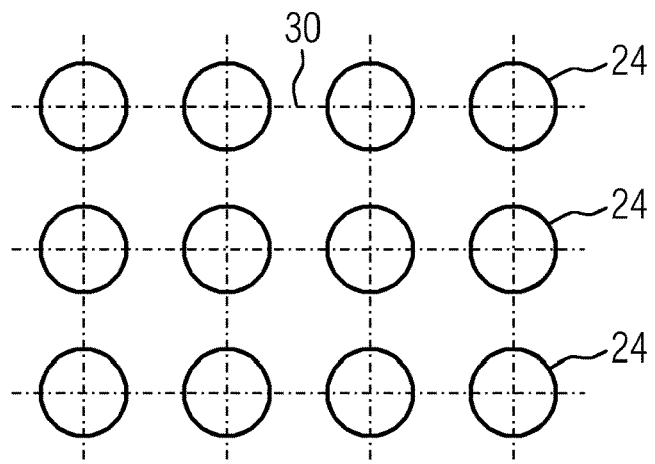
FIGS. 4 and 5 are plan views of different arrangements of outlet openings of chimneys according to the teachings of the present disclosure.
Figure 5:
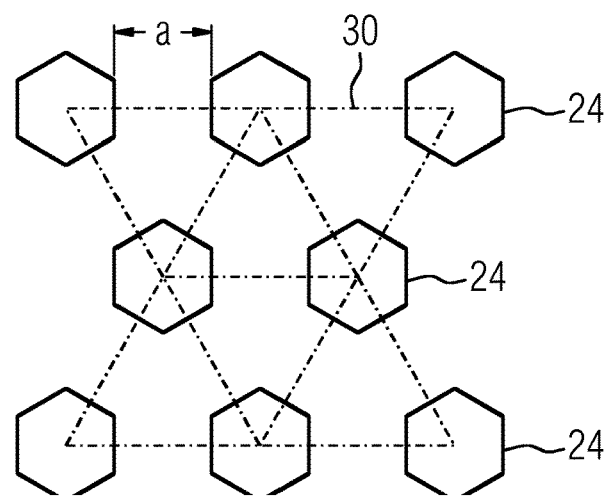

In FIGS. 4 and 5, different possibilities for a uniform arrangement of the cross-sections of the cooling chimneys are indicated, wherein the illustrated arrangements could be seen in a plan view of the cooling member from above. In both FIGS. 4 and 5, the cooling chimneys are arrayed in a grid 30. In FIG. 4, the cooling chimneys have a round cross-section, wherein these cross-sections are arranged in a square grid (indicated by dot-dash lines). In FIG. 5, a triangular grid has been selected in order to arrange the cooling channels. These have a cross-section which corresponds to a regular hexagon. Consequently, the wall thicknesses between adjacent cooling chimneys are always of the same size so that the cooling channels which are located therebetween have comparatively constant lengths.

Figure 6:
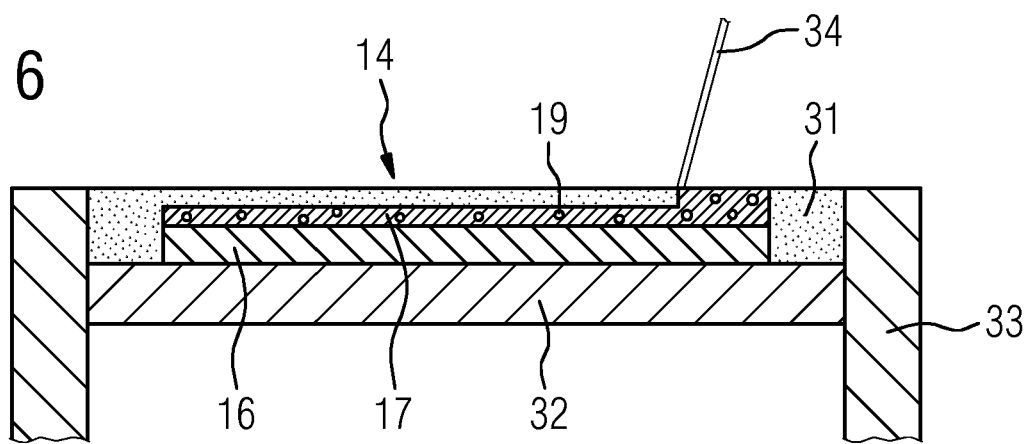
FIGS. 6 and 7 are cross-sections of selected production steps of an embodiment of the method according to the teachings of the present disclosure.
Figure 7:
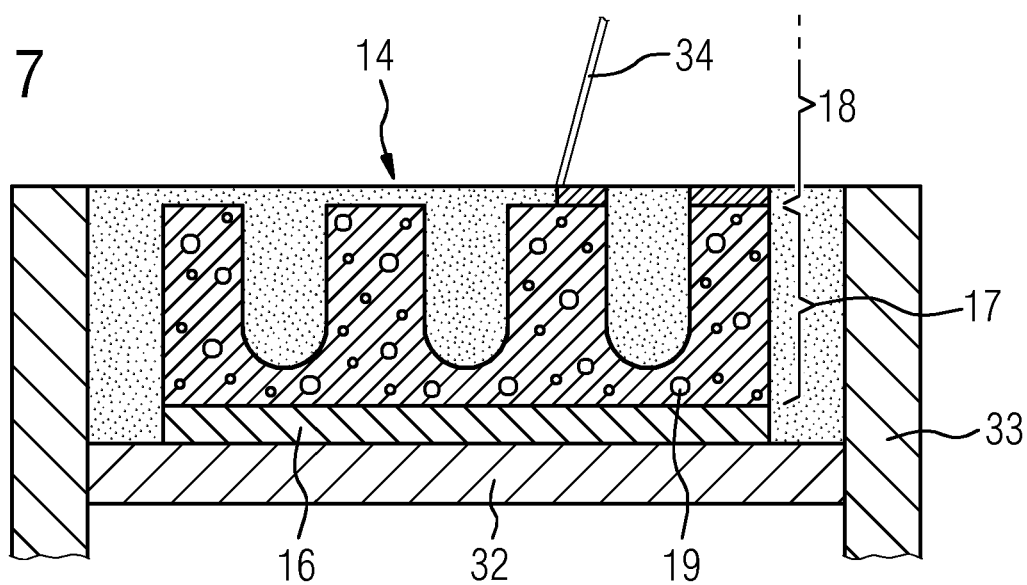

In FIGS. 6 and 7, two selected steps of an additive production method for producing the cooling member 14 are illustrated. In the production step according to FIG. 6, a laser sintering operation is carried out, whilst, in the production step according to FIG. 7, a laser melting (a component which is comparable with FIG. 3 is then produced) or a laser sintering operation with different powders (a component which is comparable with FIG. 1 is then produced) is carried out. These two process steps can be carried out in the same installation, of which by way of example only one retention device for a powder bed 31 with a construction platform 32 which can be lowered and a side boundary 33 can be seen. On the cooling member 14 which is intended to be produced, the powder bed forms in each case a construction location which according to FIG. 6 is heated with a laser beam 34 to such an extent that sintering of the powder particles occurs. The layer 17 according to FIG. 1 is thereby successively produced from a large number of structural layers, of which in FIG. 6 only the first which are already completed and the second which are in production can be seen.

For the production of the cooling member 14, the construction platform 32 is successively lowered by a construction layer thickness, wherein according to FIG. 6 the construction platform 32 is not used directly to produce the cooling member, but instead is used only as a substrate for the base plate 16 on which the powder material is melted. After completion of the component, it can therefore be removed from the construction plate 32 without the separation step which is otherwise necessary.

In FIG. 7, the lower layer 17 (comprising a plurality of sintered construction layers which are not illustrated) is completed. As illustrated in FIG. 7, the first construction layer for the upper layer 18 (cf., for example, FIG. 1) of the cooling member is now being produced. If a component according to FIG. 1 is intended to be produced, the layer is also produced by means of laser sintering, wherein a porosity is produced and, as a result of the selection of the material, a lower thermal conductivity for the upper layer 18 is produced than for the lower layer 17. A modification (not illustrated) of the method according to FIG. 7 makes provision for the lower layer 17 to be produced by means of laser melting as a grid 28 according to FIG. 3. The layer which is currently intended to be produced would then also be produced by means of laser melting to produce the cover plate 27.

Another possibility involves producing the lower layer 17 in a porous manner, as described in relation to FIG. 6. The production step illustrated in FIG. 7 can then, by changing the method from laser sintering to laser melting, be used to produce on the open-pored lower layer 17 a cover plate 27 (cf. FIG. 3) (not illustrated).

An additive production method in the context of this application refers to methods in which the material from which a component is intended to be produced is added to the component during the production. In this instance, the component is already produced in the final form thereof or at least approximately in this form. The construction material may, for example, be powdered or liquid, wherein, as a result of the additive production method, the material for producing the component is chemically or physically reinforced.

To produce the component, the data describing the component (CAD model) may be prepared for the selected additive production method. The data are converted into instructions for the production installation so that the appropriate process steps for successive production of the component can be carried out therein. Examples of additive production include selective laser sintering (SLS), selective laser melting (SLM), electron beam melting (EBM), laser welding (LMD—Laser Metal Deposition), gas dynamic cold spray (GDCS), and others. These methods are suitable for processing metal materials in the form of powders by means of which construction components can be produced.

In the case of SLM, SLS, and EBM, the components may be produced in layers in a powder bed. These methods are therefore also described as powder-bed-based additive production methods. There is produced in each case in the powder bed a layer of the powder which via the energy source (laser or electron beam) is subsequently melted or sintered locally in the regions in which the component is intended to be produced. The component is thus produced successively in layers and can be removed from the powder bed after completion.

In the case of LMD and GDCS, the powder particles are supplied directly to the surface. In the case of LMD, the powder particles are melted by means of a laser directly at the impact location on the surface and, in this case, form a layer of the component which is intended to be produced. In the case of GDCS, the powder particles are powerfully accelerated so that they primarily as a result of their kinetic energy with simultaneous deformation remain bonded to the surface of the component.

GDCS and SLS have in common that the powder particles in these methods are not completely melted. In the case of GDCS, a melting is carried out at the most in the edge region of the powder particles which, as a result of the significant deformation, can melt at the surface thereof. In the case of SLS, when selecting the sintering temperature, it is ensured that it is below the melting temperature of the powder particles. In contrast, in the case of SLM, EBM, and LMD, the energy input is deliberately so high in terms of value that the powder particles are completely melted.

What is claimed is:

1. A cooling member comprising:
   an assembly side for mounting an electronic component and an upper side opposite the assembly side;
   multiple cooling chimneys extending through the cooling member away from the assembly side which each lead to a respective outlet opening in the upper side of the cooling member, the multiple cooling chimneys including a first chimney, each cooling chimney with a primary portion having a constant cross-section; and
   a number of cooling channels with a smaller cross-section than the cross-section of the multiple cooling chimneys which lead from inlet openings in the upper side of the cooling member to the multiple cooling chimneys;
   wherein the first cooling chimney includes an expanded portion adjacent the assembly side, the expanded portion having a larger cross-section than the primary portion of the first cooling chimney and the expanded portion located closer to the assembly side than any portion of any other of the multiple cooling chimneys.

2. The cooling member as claimed in claim 1, wherein the multiple cooling chimneys extend perpendicularly from the assembly side.

3. The cooling member as claimed in claim 1, wherein the cooling channels form a three-dimensional grid.

4. The cooling member as claimed in claim 3, wherein the cooling channels comprise a metal foam.

5. The cooling member as claimed in claim 3, further comprising a cover plate formed on the upper side of the cooling member.

6. The cooling member as claimed in claim 1, wherein the assembly side comprises a solid base plate.

7. The cooling member as claimed in claim 1, further comprising a pipe attachment secured to a respective outlet opening of at least one of the multiple cooling chimneys.

8. A method for producing a cooling member having an assembly side for mounting an electronic component, the method comprising:
   fabricating the cooling member with a hollow interior by means of an additive production method;
   wherein the hollow interior comprises multiple cooling chimneys extending away from the assembly side each leading to a respective outlet opening in an upper surface of the cooling member, the multiple cooling chimneys including a first cooling chimney and, each cooling chimney with a primary portion having a constant cross-section; and
   creating a number of cooling channels with a smaller cross-sectional area than the respective cross-sectional area of any of the multiple cooling chimneys, with inlet openings in the upper surface of the cooling member and leading to the multiple cooling chimneys;
   wherein the first cooling chimney includes an expanded portion adjacent the assembly side, the expanded portion having a larger cross-sectional area than the primary portion of the first cooling chimney and the expanded portion located closer to the assembly side than any portion of any other of the multiple cooling chimneys.

9. The method as claimed in claim 8, wherein the cooling member comprises a base plate.

10. The method as claimed in either claim 8, wherein the cooling channels comprise open-pored structures.

11. The method as claimed in claim 10, wherein the additive production method comprises selective laser sintering.

12. The method as claimed in claim 8, wherein the cooling channels comprise a three-dimensional grid.

13. The method as claimed in claim 8, wherein the cooling member comprises at least two materials with different thermal conductivity; and
   in regions of the cooling member closer to the assembly side, a material with a relatively high thermal conductivity is used and, in regions of the cooling member further away from the assembly side, a material with a relatively lower thermal conductivity is used.

* * * * *